US011270756B2

(12) United States Patent
Hush et al.

(10) Patent No.: US 11,270,756 B2
(45) Date of Patent: Mar. 8, 2022

(54) ROW HAMMER MITIGATION

(71) Applicant: Micron Technology, Inc., Boise, ID (US)

(72) Inventors: Glen E. Hush, Boise, ID (US); Richard C. Murphy, Boise, ID (US); Honglin Sun, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/553,488

(22) Filed: Aug. 28, 2019

(65) Prior Publication Data

US 2021/0065775 A1 Mar. 4, 2021

(51) Int. Cl.
G11C 11/4078 (2006.01)
G06F 12/02 (2006.01)
G11C 11/406 (2006.01)
G11C 11/4096 (2006.01)
G11C 11/4091 (2006.01)
G11C 11/408 (2006.01)

(52) U.S. Cl.
CPC ...... *G11C 11/4078* (2013.01); *G06F 12/0207* (2013.01); *G11C 11/408* (2013.01); *G11C 11/4091* (2013.01); *G11C 11/4096* (2013.01); *G11C 11/40618* (2013.01)

(58) Field of Classification Search
CPC ............ G11C 11/4078; G11C 11/4091; G11C 11/408; G11C 11/4096; G11C 11/40618; G06F 12/0207
See application file for complete search history.

(56) References Cited

U.S. PATENT DOCUMENTS

| | | |
|---|---|---|
| 5,050,095 A | 9/1991 | Samad |
| 7,043,466 B2 | 5/2006 | Watanabe et al. |
| 2004/0073764 A1 | 4/2004 | Andreasson |
| 2015/0058549 A1* | 2/2015 | Jeffrey ..................... G11C 7/02 711/106 |
| 2015/0357007 A1* | 12/2015 | Manning .................. G11C 7/22 714/763 |
| 2017/0287544 A1* | 10/2017 | Hedden ................. G11C 11/406 |
| 2018/0114551 A1* | 4/2018 | Penney ................... G11C 7/065 |
| 2018/0203621 A1* | 7/2018 | Ahn ....................... G06F 3/0659 |
| 2019/0163532 A1* | 5/2019 | Kim ....................... G11C 7/1057 |
| 2019/0348107 A1* | 11/2019 | Shin ......................... G11C 8/12 |

* cited by examiner

Primary Examiner — Jerome Leboeuf
(74) Attorney, Agent, or Firm — Brooks, Cameron & Huebsch, PLLC

(57) ABSTRACT

Apparatuses and methods related to row hammer mitigation in, for example, a memory device or a computing system that includes a memory device. Data from a group of memory cells of a memory array can be latched in sensing circuitry responsive to a determination of a hammering event associated with the group of memory cells. Thereafter, the data can be accessed from the sensing circuitry.

16 Claims, 5 Drawing Sheets

ROW HAMMER MITIGATION

TECHNICAL FIELD

The present disclosure relates generally to memory, and more particularly to apparatuses and methods associated with row hammer mitigation.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. including, but not limited to personal computers, portable memory sticks, digital cameras, cellular telephones, portable music players such as MP3 players, movie players, and other electronic devices. Memory cells can be arranged into arrays, with the arrays being used in memory devices.

DETAILED DESCRIPTION

Figure 1:
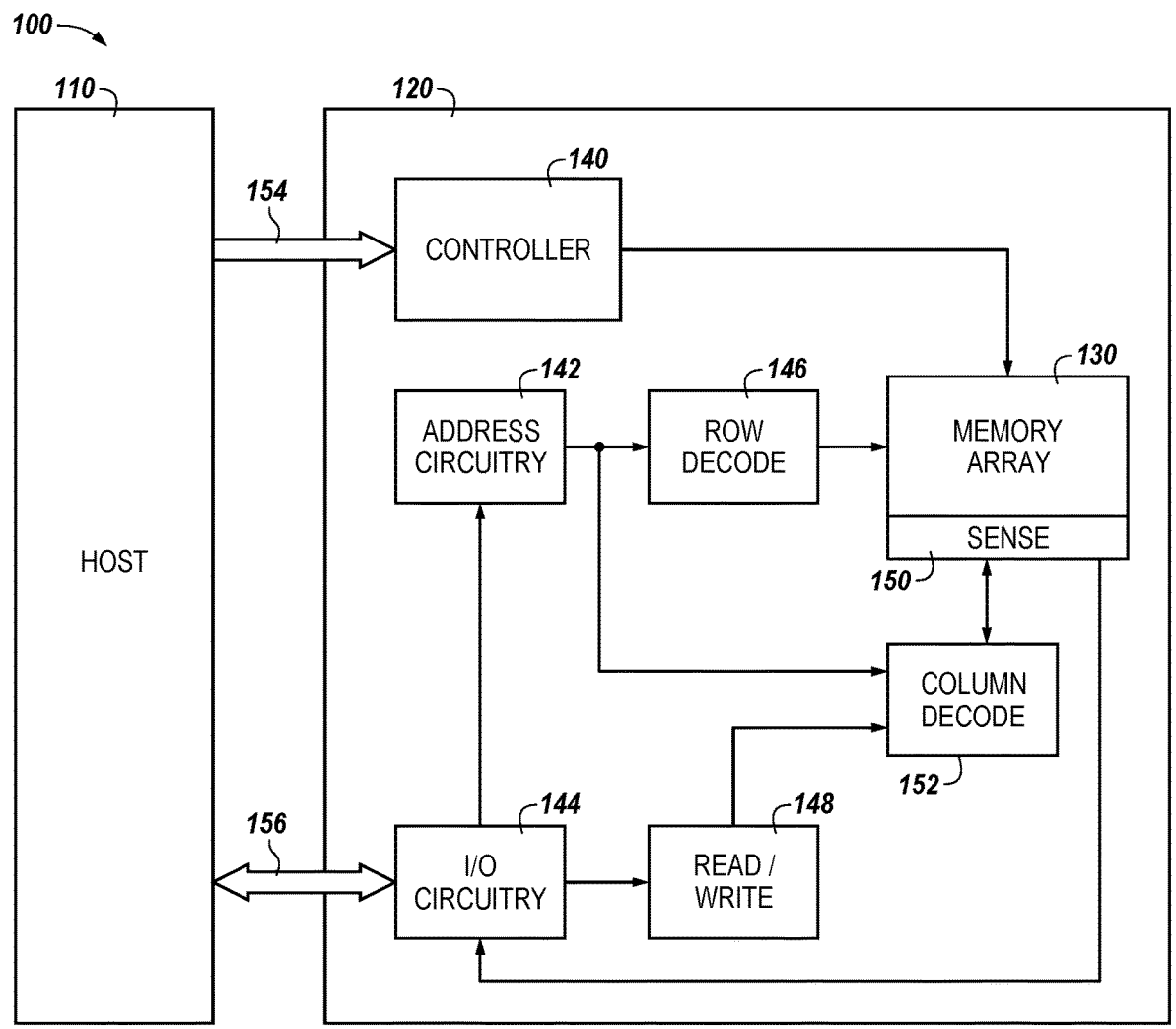
FIG. 1 is a block diagram of an apparatus in the form of a computing system in accordance with a number of embodiments of the present disclosure.

The present disclosure includes apparatuses and methods related to row hammer mitigation. An example apparatus includes a memory array, and circuitry configured to store data from a group of memory cells of a memory array in sensing circuitry responsive to a determination of a hammering event associated with the group of memory cells. The control circuitry can access the data from the sensing circuitry thereafter.

As memory density has increased, intermittent failure has appeared in some devices, such as DRAM memories, which may experience failures due to repeated access to a particular row of memory cells (e.g., cells coupled to an access line). Additionally, rows physically adjacent to a row being frequently accessed have an increased probability of experiencing data corruption. The repeated access of a particular row can be referred to as a "hammering" event, and the hammering of a row can cause issues such as charge leak across a passgate, for example. Leakage and parasitic currents caused by the hammering of a row can cause data corruption in a non-accessed physically adjacent row, which may be referred to as a neighbor row or victim row. The resulting corruption issue may be referred to as hammer disturb and/or row hammer disturb, for instance. This effect is due to the nature of a memory cell, which can include one transistor and one capacitor. The charge state of a capacitor is what determines whether a DRAM cell stores a "1" or "0" as a binary value. In addition, a large number of DRAM cells can be packed tightly together. The closely packed cells can cause an activated capacitor to have an effect on a charge of an adjacent capacitor, especially when one of the cells is rapidly activated (e.g., a row hammer effect). Thus it may be beneficial to protect data in the row being hammered and/or data in an adjacent row.

A main portion of a memory array can include a number of groups (e.g., rows) of memory cells each coupled to one of a respective number of access lines. For example, a first row of cells, a second row of cells, and a third row of cells can be three adjacent rows of cells. In response to the second (middle) row of cells being accessed in rapid succession, the first row and the third row can experience leakage and/or interact electrically.

Embodiments of the present disclosure can mitigate the effects of row hammering. In some embodiments, for instance, a hammering event can be determined before data is corrupted. The data of the row being hammered can be "moved" to a safer location. Stated differently, the data of a row that has been determined to be undergoing a hammering event can be stored (e.g., latched) in sensing circuitry. Alternatively or additionally, in some embodiments, data from a number of rows adjacent to a row being hammered can be stored in sensing circuitry. Thereafter, that data can be accessed from the sensing circuitry. Accessing the data from the sensing circuitry, instead of from the row being hammered, can reduce (e.g., eliminate) the corrupting effects of row hammer.

Sensing circuitry, as referred to herein, can include a sense amplifier (sometimes referred to herein as "sense amp") associated with an array of memory cells. A sense amp may function as a latch serving as an accumulator. In some embodiments, sensing circuitry can include a plurality of sense amps associated with an array of memory cells. One or more sense amps can store the data of one or more rows being hammered. Thereafter, when a command to access the hammered row is received, the corresponding data can be accessed not from the hammered row(s), but from the sense amp(s). As described further herein, data from a row being hammered can be stored in internal sensing circuitry (e.g., an internal sense amp), and data from a row being hammered can be stored in peripheral (e.g., external) sensing circuitry (e.g., a peripheral and/or extended row address (XRA) sense amp). Accessing the data from a sense amp, even repeatedly in a short time period, may not have the same detrimental effects as row hammering in a memory array. This is due, for instance, to the physical characteristics of the sense amp that differ from a memory cell and a row of memory cells.

As used herein, "a number of" something can refer to one or more of such things. For example, a number of memory devices can refer to one or more memory devices. A "plurality" of something intends two or more. Additionally, designators such as "N," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 100 in accordance with a number of embodiments of the present disclosure. As used herein, a host 110, a memory device 120, a memory array 130, and/or sensing circuitry 150 might also be separately considered an "apparatus" and/or a device.

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry) such as a CPU, SoC, ASIC, and/or memory buffer (e.g., registered dual in-line memory module (DIMM)). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 120 may include a number of arrays 130 (e.g., a number of banks of DRAM cells).

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The read/write circuitry 148 is used to write data to the memory array 130 or read data from the memory array 130. As an example, the circuitry 148 can comprise various drivers, latch circuitry, etc.

The controller 140 can comprise control circuitry (e.g., hardware, firmware, and/or software). The controller 140 can comprise a state machine, a sequencer, or some other type of controller. In a number of embodiments, the controller 140 can comprise an application specific integrated circuit (ASIC) and/or a field programmable gate array (FPGA) coupled to a printed circuit board including a physical interface. Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. As described further below, the controller 140 can comprise multiple controllers (e.g., separate controller units). In a number of embodiments, the sensing circuitry 150 can comprise a number of sense amplifiers.

In accordance with the present disclosure, the controller 140 can store data from a group of memory cells of the memory array 130 in sensing circuitry 150 responsive to a determination of a hammering event associated with the group of memory cells. The controller 140 can cause data from a group of memory cells of the memory array 130 to be stored in sensing circuitry 150 responsive to a determination of a hammering event associated with the group of memory cells. Thereafter, the controller 140 can access the data from the sensing circuitry 150 (e.g., instead of from the group of memory cells).

Figure 2:
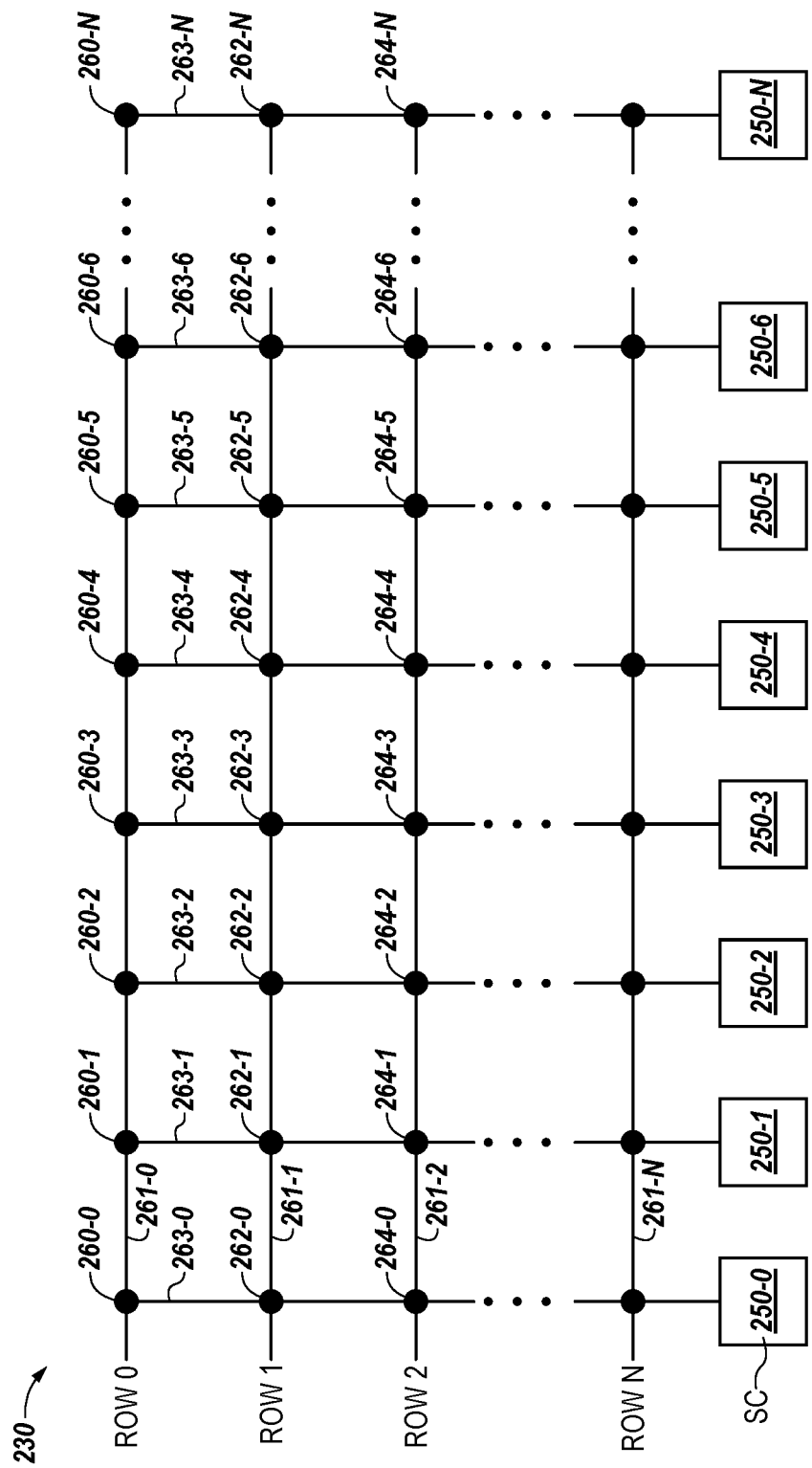
FIG. 2 illustrates a schematic diagram of a portion of a memory array in accordance with a number of embodiments of the present disclosure.

FIG. 2 illustrates a schematic diagram of a portion of a memory array 230 in accordance with a number of embodiments of the present disclosure. As shown in FIG. 2, the memory array 230 includes a plurality of memory cells. Memory cells 260-0, 260-1, 260-2, 260-3, 260-4, 260-5, 260-6, . . . , 260-N, referred to generally as memory cells 260, are included in Row 0. Memory cells 262-0, 262-1, 262-2, 262-3, 262-4, 262-5, 262-6, . . . , 262-N, referred to generally as memory cells 262, are included in Row 1. Memory cells 264-0, 264-1, 264-2, 264-3, 264-4, 264-5, 264-6, . . . , 264-N, referred to generally as memory cells 264, are included in Row 2. It is noted that the array 230 can include additional memory cells that are not illustrated in FIG. 2.

The memory cells 260, the memory cells 262, and the memory cells 264 can be coupled to rows of access lines 261-0, 261-1, 261-2, . . . , 261-N and columns of sense lines 263-0, 263-1, 263-2, 263-3, 263-4, 263-5, 263-6, . . . , 263-N, which may be referred to generally as access lines 261 and sense lines 263. Memory array 230 is not limited to a particular number of access lines and/or sense lines, and use of the terms "rows" and "columns" does not intend a particular physical structure and/or orientation of the access lines and/or sense lines.

Each column of memory cells can be coupled to sensing circuitry. The example illustrated in FIG. 2 includes a number of sensing circuitries 250-0, 250-1, 250-2, 250-3, 250-4, 250-5, 250-6, . . . , 250-N, referred to generally as sensing circuitries 250, coupled to the respective sense lines 263-0, 263-1, 263-2, 263-3, 263-4, 263-5, 263-6, . . . , 263-N. The sensing circuitries 250 can comprise latches, such as sense amps, for instance. For example, a number of sense lines 263 and access lines 261 in array 230 can be activated to read the data in the array 230. The data can be stored in the sensing circuitries 250.

A controller (e.g., the controller 140, illustrated in FIG. 1) can determine a hammering event associated with a group (e.g., a row) of the memory cells of the array 230. As previously discussed, determining a hammering event can include determining that a row (e.g., Row 1 including memory cells 262) is being repeatedly accessed. Determining a row hammer event may include determining (e.g., identifying) a row targeted by a row hammer event. Determining a row hammer event can include determining a number of rows that may not be specifically targeted but are potentially affected by a row hammer event (e.g., row(s) adjacent to a targeted row). If, for example, Row 1 is the target of a hammering event, adjacent rows (Row 0 and/or Row 2) may be at risk of row hammer disturb. In some embodiments, determining a hammering event includes determining that the group has been accessed a particular quantity of times exceeding a quantity threshold. In some embodiments, determining a hammering event includes determining that the group has been, or is being, accessed a threshold quantity of times within a time period. Stated differently, determining a hammering event can include determining that the group has been, or is being, accessed at a rate exceeding a threshold rate (e.g., 20 accesses per microsecond). In some embodiments, these quantities and/or rates may be predetermined (e.g., fixed). In some embodiments, such quantities and/or rates may be configurable.

In some embodiments, the controller 140 may determine a hammering event using a counter. A counter can include logic configured to count access requests in a memory array. As will be appreciated, a counter can be implemented in various manners. If a counter indicates that a group of memory cells has been, or is being, accessed a quantity of times exceeding the quantity threshold the controller can determine a hammering event. If a counter indicates that the group of memory cells has been, or is being, accessed at a rate exceeding the threshold rate, the controller can determine a hammering event. It is noted that while a single counter is discussed herein, embodiments of the present disclosure are not limited to a particular number of counters.

In some embodiments, the controller may determine a hammering event using a spiking neural network. As will be appreciated, a spiking neural unit of a spiking neural network can include multiplexors and comparators. A multiplexor can collect a weight stored in memory cells and a comparator can compare the weight from the memory cells to a threshold weight. In some embodiments, one or more access requests can increase the weight stored in the memory cells. The controller can determine that a spiking neural unit has spiked in response to the weight from the memory cells being greater than the threshold weight. Stated differently, a spike, when detected, may indicate a threshold-exceeding quantity and/or rate of row accesses, and thus a hammering event. Embodiments herein, however, are not intended to be limited to a particular manner of determining a hammering event.

If, for example, the controller determines a hammering event associated with the memory cells 262, the cells of the neighboring rows (memory cells 260 and/or 264), in addition to the memory cells 262, may be at risk of corruption. The controller can store (e.g., latch) the data from the memory cells 262 into the sensing circuitries 250 to avoid the row hammering and mitigate the risk. Later, when, for example, a command is received to access the memory cells 262, the controller can access the data from the sensing circuitries 250 (e.g., instead of from the memory cells 262). Because the subsequent access is made from the sensing circuitries and not from the memory cells 262, the risk of corruption to the neighboring cells 260 and/or 264 can be mitigated.

Figure 3:
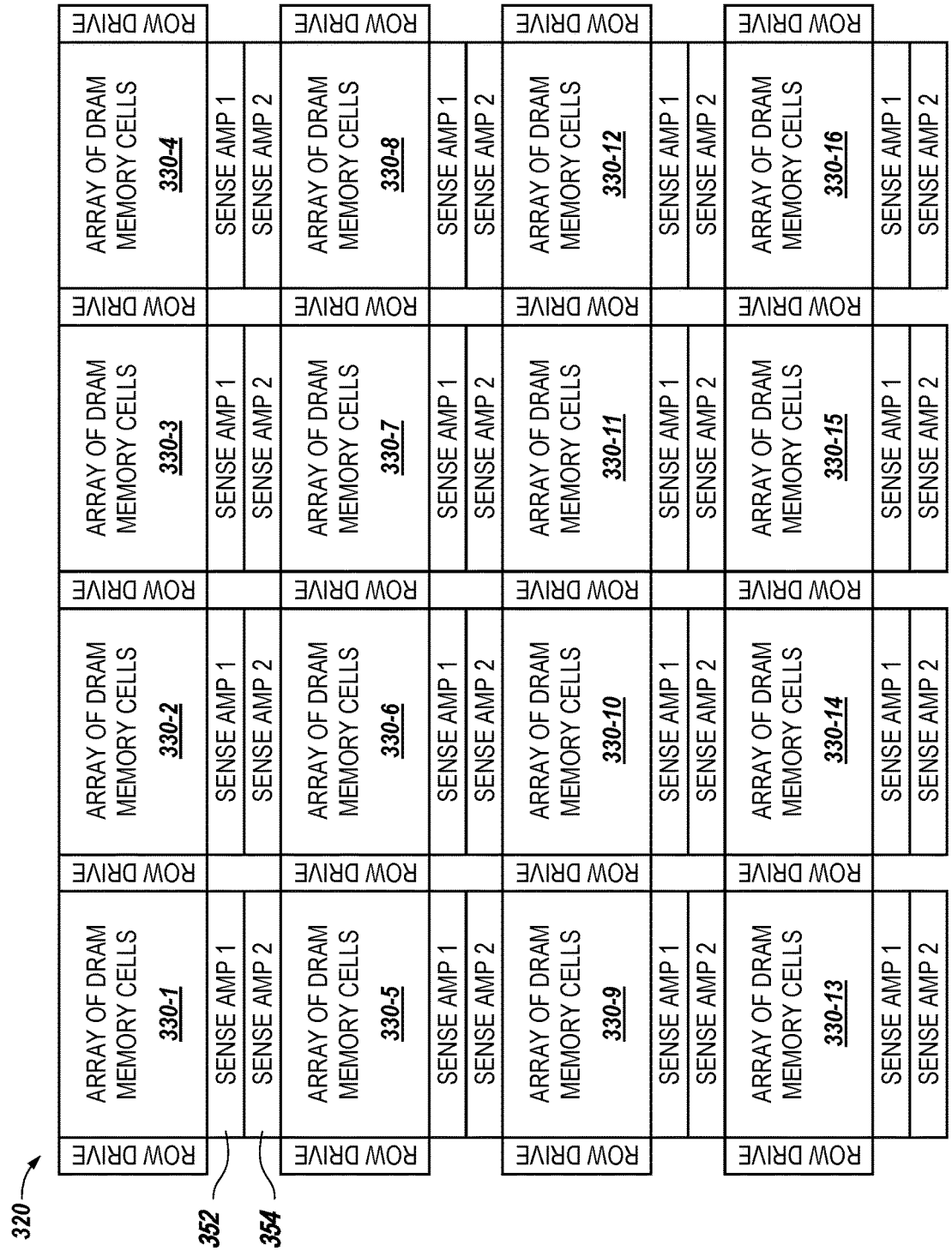
FIG. 3 is a block diagram of an example memory device including a number of memory arrays in accordance with a number of embodiments of the present disclosure.

FIG. 3 is a block diagram of an example memory device 320 including a number of memory arrays in accordance with a number of embodiments of the present disclosure. The example device 320 includes memory arrays 330-1, 330-2, 330-3, 330-4, 330-5, 330-6, 330-7, 330-8, 330-9, 330-10, 330-11, 330-12, 330-13, 330-14, 330-15, 330-16, referred to generally as arrays 330. Though sixteen memory arrays 330 are shown in FIG. 3, it is noted that embodiments herein are not so limited. Each of the memory arrays 330 is associated with (e.g., is coupled to) sensing circuitry. For example, the memory array 330-1 is associated with a first sense amp 352 and a second sense amp 354. In accordance with the present disclosure, the second sense amp 354 can be a "redundant" sense amp. For instance, the second sense amp 354 can be utilized to latch data from groups (e.g., rows) of memory cells of the array 330-1 to mitigate hammering thereof in a manner analogous to that discussed above in connection with the sensing circuitries 250. It is noted, however, that either or both of the sense amp 352 and the sense amp 354 can store data from groups of memory cells of the array 330-1 to mitigate hammering thereof.

Figure 4:
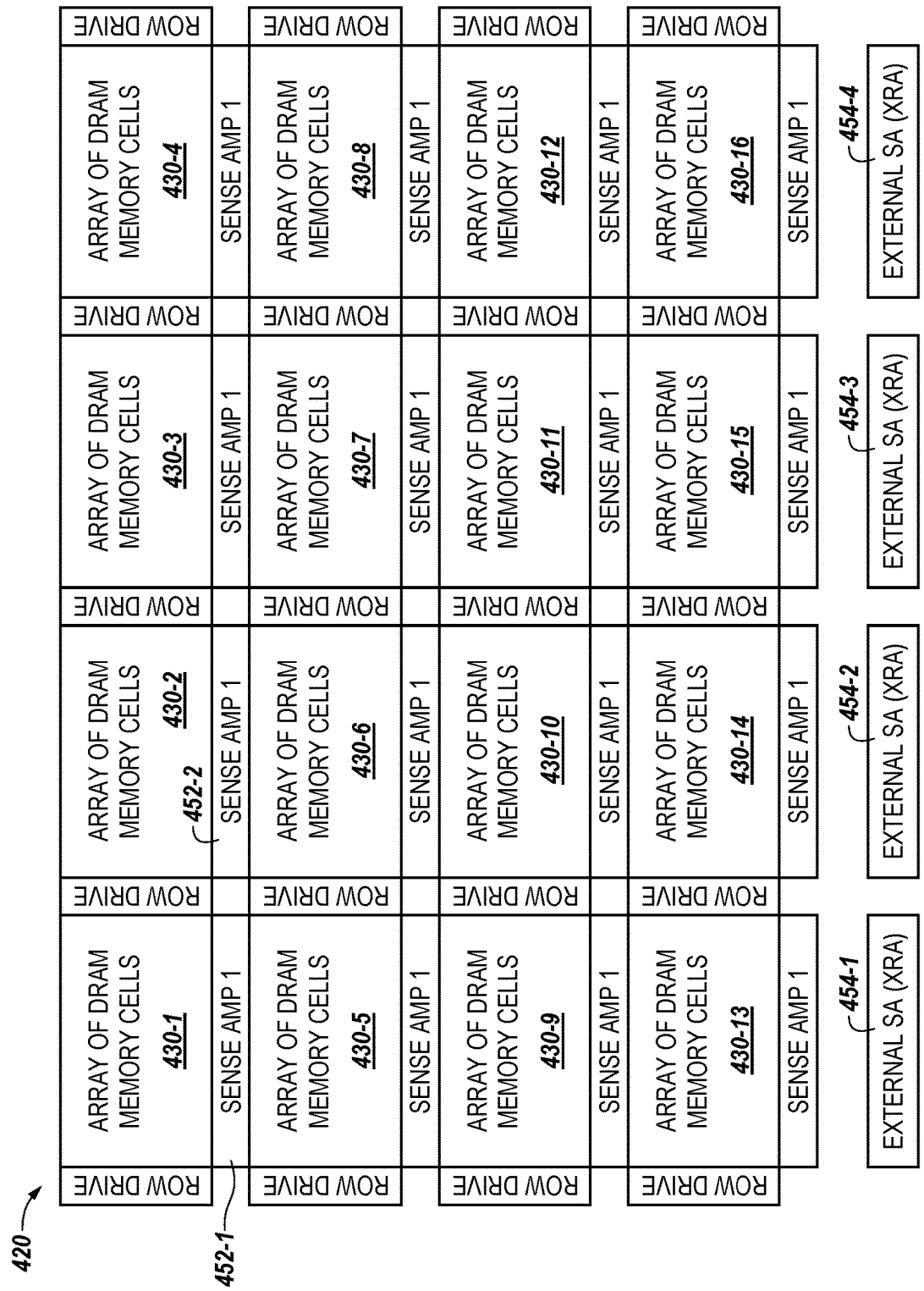
FIG. 4 is a block diagram of another example memory device including a number of memory arrays in accordance with a number of embodiments of the present disclosure.

FIG. 4 is a block diagram of another example memory device 420 including a number of memory arrays in accordance with a number of embodiments of the present disclosure. The example device 420 includes memory arrays 430-1, 430-2, 430-3, 430-4, 430-5, 430-6, 430-7, 430-8, 430-9, 430-10, 430-11, 430-12, 430-13, 430-14, 430-15, 430-16, referred to generally as arrays 430. Though sixteen memory arrays 430 are shown in FIG. 4, it is noted that embodiments herein are not so limited. Each of the memory arrays 430 is associated with (e.g., is coupled to) sensing circuitry. For example, the memory array 430-1 is associated with a sense amp 452-1 and the memory array 430-2 is associated with a sense amp 452-2. As shown in the example illustrated in FIG. 4, the example device 420 includes a plurality of peripheral (e.g., external) sense amps: a first peripheral sense amp 454-1, a second peripheral sense amp 454-2, a third peripheral sense amp 454-3, and a fourth peripheral sense amp 454-4, referred to generally as sense amps 454. The peripheral sense amps 454 can be located on a periphery of the memory device 420 (e.g., a periphery of a bank of the memory device 420). In some embodiments, the peripheral sense amps 454 can be or include XRA components (e.g., XRA latches or registers). Each column of arrays is associated with a respective peripheral sense amp. The arrays 430-1, 430-5, 430-9, and 430-13 are associated with the first peripheral sense amp 454-1. The arrays 430-2, 430-6, 430-10, and 430-14 are associated with the second peripheral sense amp 454-2. The arrays 430-3, 430-7, 430-11, and 430-15 are associated with the third peripheral sense amp 454-3. The arrays 430-4, 430-8, 430-12, and 430-16 are associated with the fourth peripheral sense amp 454-4. In some embodiments, any of the peripheral sense amps 454 can store data from groups of memory cells of any of the arrays 430 to mitigate hammering thereof in a manner analogous to that discussed above in connection with the sensing circuitries 250.

Figure 5:
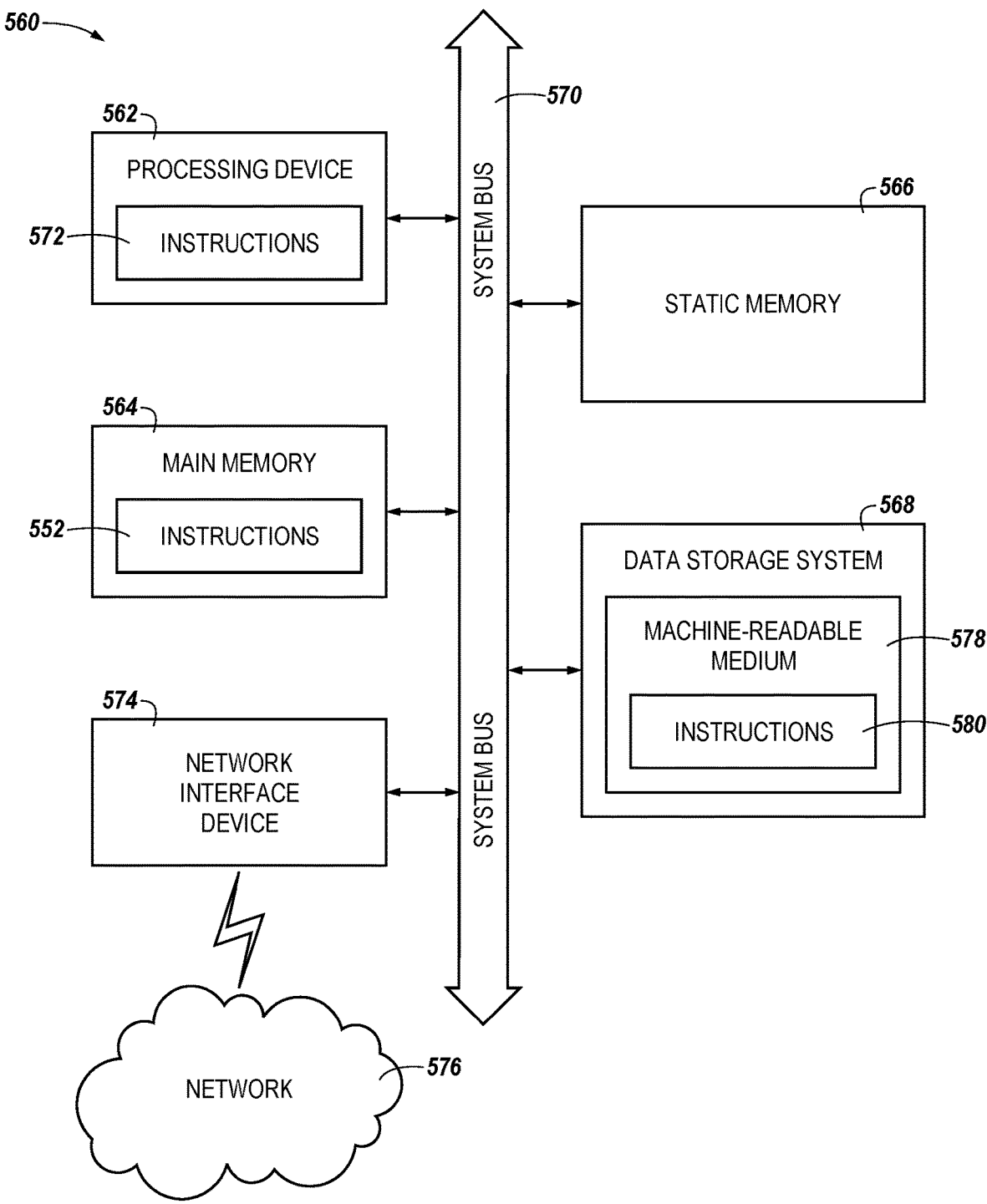
FIG. 5 illustrates an example machine of a computer system within which a set of instructions, for causing the machine to perform various methodologies discussed herein, can be executed.

FIG. 5 illustrates an example machine of a computer system 560 within which a set of instructions, for causing the machine to perform various methodologies discussed herein, can be executed. In various embodiments, the computer system 560 can correspond to a system (e.g., the system 100 of FIG. 1) that includes, is coupled to, or utilizes a memory sub-system (e.g., the memory device 120 of FIG. 1) or can be used to perform the operations of a controller (e.g., the controller 140 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 560 includes a processing device 562, a main memory 564 (e.g., read-only memory (ROM), flash memory, dynamic random access memory (DRAM) such as synchronous DRAM (SDRAM) or Rambus DRAM (RDRAM), etc.), a static memory 566 (e.g., flash memory, static random access memory (SRAM), etc.), and a data storage system 568, which communicate with each other via a bus 570.

Processing device 562 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 562 is configured to execute instructions 572 for performing the operations and steps discussed herein. The computer system 560 can further include a network interface device 574 to communicate over the network 576.

The data storage system 568 can include a machine-readable storage medium 578 (also known as a computer-readable medium) on which is stored one or more sets of instructions 580 or software embodying any one or more of the methodologies or functions described herein. The instructions 580 can also reside, completely or at least partially, within the main memory 564 and/or within the processing device 562 during execution thereof by the computer system 560, the main memory 564 and the processing device 562 also constituting machine-readable storage media.

In one embodiment, the instructions 572 include instructions to implement functionality corresponding to the host 110 and/or the memory device 120 of FIG. 1. While the machine-readable storage medium 578 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory array of a memory device, the memory array comprising rows of access lines and columns of sense lines;
   sensing circuitry coupled to the memory array, the sensing circuitry comprising:
      a respective sense amplifier coupled to each of the sense lines; and
      a respective redundant sense amplifier coupled to each of the sense lines; and
   control circuitry coupled to the memory array and configured to cause:
      data to be accessed from memory cells of a particular row of the memory array using the respective sense amplifiers responsive to a command from a host to access the particular row;
      data from the memory cells to be latched in the respective redundant sense amplifiers responsive to a determination of a hammering event associated with the particular row of memory cells; and
      subsequent to the hammering event, the data to be accessed from the respective redundant sense amplifiers responsive to a subsequent command to access the particular row.

2. The apparatus of claim 1, wherein the control circuitry is configured to access the data from the redundant sense amplifier instead of the memory cell responsive to receiving the command to access the memory cell.

3. The apparatus of claim 1, wherein the redundant sense amplifier comprises a latch.

4. The apparatus of claim 3, wherein the control circuitry is configured to cause data from the particular row of memory cells to be latched in a particular quantity of latches.

5. The apparatus of claim 4, wherein the particular quantity of latches cumulatively provides storage for a full row of memory cells of the memory array.

6. The apparatus of claim 1, wherein the memory array is a dynamic random access memory (DRAM) array.

7. A method, comprising:
accessing data from a memory cell of a memory array of a memory device, the memory array comprising rows of access lines and columns of sense lines, using a sense amplifier coupled to a particular sense line that is coupled to the memory cell responsive to a command from a host to read the memory cell;
determining an occurrence of a row hammer associated with a group of memory cells of which the memory cell is a part, the group of memory cells storing data;
latching the data from the memory cell in a redundant sense amplifier coupled to the particular sense line responsive to determining the occurrence of the row hammer and before receiving a read command, a write command, or a refresh command; and
accessing the data from the redundant sense amplifier thereafter responsive to receiving a subsequent command to read the memory cell.

8. The method of claim 7, wherein the method includes:
latching the data from the memory cell in the redundant sense amplifier, wherein the redundant sense amplifier is located in peripheral circuitry of the memory device that comprises the memory array; and
accessing the data from the redundant sense amplifier located in the peripheral circuitry responsive to receiving the command to read the memory cell.

9. The method of claim 7, wherein the method includes:
latching the data from the memory cell in the redundant sense amplifier, wherein the redundant sense amplifier is located adjacent to the memory array; and
accessing the data from the redundant sense amplifier located adjacent to the memory array responsive to receiving the command to read the memory cell.

10. An apparatus, comprising:
a memory array of a memory device, the memory array comprising access lines and sense lines and having a plurality of groups of memory cells;
sensing circuitry associated with the memory array of the memory device, wherein the sensing circuitry includes a sense amplifier coupled to a particular sense line and a redundant internal sense amplifier coupled to the particular sense line; and
control circuitry coupled to the memory array and configured to cause:
data to be accessed from a memory cell of the memory array using the sense amplifier responsive to a command from a host to read the memory cell;
an occurrence of a hammering event associated with a particular group of memory cells of which the memory cell is a part to be determined, the particular group of memory cells storing data;
data from the memory cell to be latched in the redundant sense amplifier responsive to determining the occurrence of the hammering event; and
the data to be accessed from the redundant sense amplifier responsive to receiving a subsequent command to read the memory cell.

11. The apparatus of claim 10, wherein the control circuitry is configured to cause the hammering event to be determined responsive to a determination that the particular group of memory cells has been accessed at a threshold rate.

12. The apparatus of claim 10, wherein the control circuitry is configured to cause the hammering event to be determined responsive to a determination that the particular group of memory cells has been accessed a threshold-exceeding quantity of times within a time period.

13. The apparatus of claim 10, wherein the sense amplifier and the redundant sense amplifier are internal sense amplifiers.

14. A method, comprising:
accessing data from a group of memory cells of a memory array of a memory device, the memory array comprising access lines and sense lines, using sense amplifiers coupled to a subset of the sense lines responsive to a command from a host to read the group of memory cells;
determining an occurrence of a hammering event associated with the group of memory cells, the group of memory cells storing data;
latching the data from the group of memory cells in redundant sense amplifiers coupled to the subset of sense lines responsive to determining the occurrence of the hammering event and before data stored in an adjacent group of memory cells is disturbed by the occurrence of the hammering event; and
accessing the latched data responsive to receiving a subsequent command to access the group of memory cells.

15. The method of claim 14, wherein the method includes determining the occurrence of the hammering event using a counter.

16. The method of claim 14, wherein the method includes determining the occurrence of the hammering event via a detection of a spike in a spiking neural network.

* * * * *